(12) United States Patent
Osen et al.

(10) Patent No.: US 10,459,044 B2
(45) Date of Patent: Oct. 29, 2019

(54) TEMPERATURE CONTROL OF AN NMR-MAS ROTOR

(71) Applicant: Bruker BioSpin GmbH, Rheinstetten (DE)

(72) Inventors: David Osen, Ettlingen (DE); Armin Purea, Bad Schoenborn (DE); Benno Knott, Karlsruhe (DE); Fabian Kuehler, Schwerzenbach (CH); Florian Helbing, Zurich (CH); Alia Hassan, Binz (CH); Jevgeni Guidoulianov, Wetzikon (CH); Nicolas Freytag, Binz (CH)

(73) Assignee: BRUKER BIOSPIN GMBH, Rheinstetten (DE)

( * ) Notice: Subject to any disclaimer, the term of this patent is extended or adjusted under 35 U.S.C. 154(b) by 45 days.

(21) Appl. No.: 15/718,723

(22) Filed: Sep. 28, 2017

(65) Prior Publication Data

US 2018/0088190 A1   Mar. 29, 2018

(30) Foreign Application Priority Data

Sep. 28, 2016 (DE) .................. 10 2016 218 772

(51) Int. Cl.
    *G01R 33/31* (2006.01)
    *G01R 33/30* (2006.01)

(52) U.S. Cl.
    CPC ........... *G01R 33/31* (2013.01); *G01R 33/307* (2013.01)

(58) Field of Classification Search
    CPC .... G01R 33/282; G01R 33/302; G01R 33/34; G01R 33/3403; G01R 33/307; G01R 33/31
    (Continued)

(56) References Cited

U.S. PATENT DOCUMENTS

| 4,254,373 A | * | 3/1981 | Lippmaa ............... G01R 33/31 324/321 |
| 4,511,841 A | | 4/1985 | Bartuska et al. |

(Continued)

FOREIGN PATENT DOCUMENTS

| JP | H04-504308 A | 7/1992 |
| JP | 2005-283335 A | 10/2005 |

(Continued)

OTHER PUBLICATIONS

"Overview Very Fast 1.3mm MAS", www.bruker.com/de/products/mr/nmr/probes/probes/solids/very-fast-mas/13-mm/overview.html; Germany, retrieved from Internet on Aug. 24, 2017.

(Continued)

*Primary Examiner* — Patrick Assouad
*Assistant Examiner* — Demetrius R Pretlow
(74) *Attorney, Agent, or Firm* — Edell, Shapiro & Finnan, LLC

(57) ABSTRACT

A method for operating an NMR probehead (10) with an MAS stator (11) receiving a circular-cylindrical hollow MAS rotor (13) with an outer jacket. The MAS rotor is mounted on pressurized gas in a measuring position within the MAS stator via a gas supply device with a bearing nozzle (12') and rotates about the cylinder axis of the MAS rotor at a rotation frequency f≥30 kHz. During a measurement, a temperature control gas is blown by a temperature control nozzle (12) onto the outer jacket of the rotor at an angle α<90° with respect to the longitudinal axis of the cylinder-symmetrical rotor. The flow speed of the temperature control gas corresponds in the nozzle cross section to at least half the circumferential speed of the outer jacket of the rotating rotor and to at most the speed of sound in the temperature control gas.

19 Claims, 6 Drawing Sheets

(58) Field of Classification Search
USPC .......................................................... 324/309
See application file for complete search history.

(56) References Cited

U.S. PATENT DOCUMENTS

| | | | |
|---|---|---|---|
| 4,940,942 A | 7/1990 | Bartuska et al. | |
| 5,289,130 A | 2/1994 | Doty | |
| 7,915,893 B2* | 3/2011 | Shevgoor | G01R 33/307 |
| | | | 324/318 |
| 8,212,565 B2 | 7/2012 | Bez | |
| 9,482,729 B2 | 11/2016 | Gisler et al. | |
| 10,088,538 B2 | 10/2018 | Mizuno et al. | |
| 10,113,984 B2* | 10/2018 | Barnes | G01R 33/60 |
| 2006/0041091 A1* | 2/2006 | Chang | C08F 214/18 |
| | | | 526/247 |
| 2006/0082371 A1* | 4/2006 | Doty | G01R 33/307 |
| | | | 324/321 |
| 2006/0152221 A1* | 7/2006 | Doty | G01R 33/307 |
| | | | 324/318 |
| 2006/0176056 A1* | 8/2006 | Doty | G01R 33/307 |
| | | | 324/321 |
| 2008/0297157 A1* | 12/2008 | Hu | G01N 24/08 |
| | | | 324/321 |
| 2009/0183860 A1 | 7/2009 | Krencker et al. | |
| 2010/0026302 A1* | 2/2010 | Doty | G01R 33/307 |
| | | | 324/318 |
| 2010/0109666 A1* | 5/2010 | Armbruster | G01R 33/307 |
| | | | 324/318 |
| 2012/0302550 A1* | 11/2012 | Basford | C07D 487/06 |
| | | | 514/212.06 |
| 2013/0091870 A1 | 4/2013 | Krencker | |
| 2014/0125340 A1* | 5/2014 | Hunkeler | G01R 33/307 |
| | | | 324/321 |
| 2015/0177341 A1* | 6/2015 | De Paepe | G01R 33/305 |
| | | | 324/309 |
| 2016/0223628 A1* | 8/2016 | Fujiwara | G01R 33/282 |
| 2016/0334478 A1* | 11/2016 | Osen | G01R 33/302 |
| 2017/0074811 A1* | 3/2017 | Barnes | G01R 33/60 |
| 2017/0176362 A1* | 6/2017 | Endo | G01N 24/082 |
| 2017/0199255 A1* | 7/2017 | Bouleau | F25B 9/00 |

FOREIGN PATENT DOCUMENTS

| | | |
|---|---|---|
| JP | 2011-095261 A | 5/2011 |
| JP | 2013-088433 A | 5/2013 |
| JP | 2014-089178 A | 5/2014 |
| JP | 2016-145747 A | 8/2016 |

OTHER PUBLICATIONS

D. Wilhelm et al., "Fluid flow dynamics in MAS systems", Journal of Magnetic Resonance 257, 2015, pp. 51-63.

Venita Daebel, "Introduction to Proton Detection in Biological Samples under Ultra-Fast Magic Angle Spinning", Apr. 2015, pp. 1-6,.

Wilheim et al., "Fluid flow dynamics in MAS systems" Journal of Magnetic Resonance, Jun. 1, 2015, pp. 51-63.

Brus, "Heating of samples induced by fast magic-angle spinning", Solid State Nuclear Magnetic Resonance, Jun. 2000, pp. 151-160.

Aguilar-Parrilla et al., "Temperature Gradients and Sample Heating in Variable Temperature High Speed MAS NMR Spectroscopy", Journal of Magnetic Resonance, 87, May 1990, pp. 592-597.

* cited by examiner

TEMPERATURE CONTROL OF AN NMR-MAS ROTOR

CROSS REFERENCE TO RELATED APPLICATIONS

The following disclosure is based on and claims the benefit of and priority under 35 U.S.C. § 119(a) to German Patent Application No. 10 2016 218 772.4, filed Sep. 28, 2016, and the disclosure of which is incorporated in its entirety into the present Continuation by reference.

FIELD OF THE INVENTION

The invention relates generally to the field of magnetic resonance (NMR), and to a method for operating an NMR probehead as well as to an associated NMR probehead with an MAS stator and an MAS rotor.

BACKGROUND

More specifically, the present application relates to a method for operating an NMR probehead with an MAS stator for receiving a substantially circular-cylindrical hollow MAS rotor with an outer jacket of external diameter D and with a sample substance in a sample volume. The MAS rotor is mounted on pressurized gas in a measuring position within the MAS stator via a gas supply device and is set into rotation about the cylinder axis of the MAS rotor by a pneumatic drive, at a rotation frequency f≥30 kHz. During the NMR-MAS measurement, a temperature control gas is blown by a temperature control nozzle onto the outer jacket of the MAS rotor at an angle α<90° with respect to the longitudinal axis of the cylinder-symmetrical MAS rotor.

Such a method and a corresponding NMR probehead with an MAS stator and an MAS rotor are known, for example, from U.S. Pat. No. 7,915,893 B2.

Nuclear magnetic resonance (NMR) spectroscopy is a commercially widespread method in MR for characterizing the chemical composition of substances. In MR, the measurement sample which is situated in a strong static magnetic field is generally irradiated by radiofrequency (RF) pulses, and the electromagnetic reaction of the sample is measured.

Furthermore, it is known in solid-state NMR spectroscopy to rotate an NMR sample tilted at the so-called "magic angle" of approximately 54.74° in relation to the static magnetic field during the spectroscopic measurement ("MAS"=Magic Angle Spinning) in order to minimize line broadening on account of anisotropic interactions. To this end, the sample is inserted into an MAS rotor. MAS rotors are cylindrical tubes which are sealed with one or two caps, the upper one being provided with blade elements ("impeller"). The MAS rotor is arranged in an MAS stator, and the MAS rotor is driven to rotate by gas pressure by way of the blade elements. The totality of MAS rotor and MAS stator is referred to as MAS turbine.

The MAS turbine is arranged in an NMR-MAS probehead during the NMR measurement. The probehead comprises a cylindrical shielding tube. Housed therein are RF electronic components, in particular RF coils, and the MAS turbine. With its shielding tube, the probehead is typically inserted from below into the vertical room-temperature bore of a superconducting magnet, positioned therein and held therein with hooks, supports, screws or the like. The MAS turbine is then situated precisely in the magnetic center of the magnet.

During the rotation of samples, the rotor wall heats on account of the air friction. The central area exactly between the air bearings experiences the greatest heating. This leads to 1. non-uniform temperature distribution across the sample substance, and
2. undesired heating of the sample substance, such that a lower target temperature cannot be set or such that the sample is actually destroyed by heat.

The temperature of the rotor is usually controlled via so-called VT channels or nozzles, which are directed approximately at the rotor center. Temperature-controlled gas is either injected into the radial bearings, if appropriate branched away from there (so-called VTN design), or delivered via a separate channel, wherein the bearings are then operated (so-called DVT design) at a VT-independent temperature, for example room temperature.

A predominant feature of the VTN and DVT solutions lies in the configuration of the temperature control nozzles. On account of the positioning and/or the size of the temperature control nozzles, they introduce the gas such that the gas speed directly at the rotor is considerably lower than the circumferential speed of the rotor, with the result that the cooling outlay is very high in order to control the temperature of the sample even just slightly below the room temperature (see the comparison table below).

A further disadvantage is that in all cases a temperature gradient establishes itself along the length of the rotor, which is undesirable; i.e. at the center of the rotor there is heating to ca. 55° C. at a total length of only 6 mm (see in the drawing the figure "Simulation report").

This problem of temperature control is particularly pronounced in the case of small diameters D≤1.9 mm.

Since the temperature regulation and in particular the cooling of MAS rotors represent a very considerable aspect of solid-state spectroscopy, there are various strategies for improving these.

U.S. Pat. No. 5,289,130 has described the strategy of using the outflowing drive gas for cooling the rotor. Here, the gas is guided parallel to the rotor surface and guided off at the center. In this gas delivery, it is assumed that the gas speed on impacting the rotor is already too low to significantly cool the rotor. If the gas speed is still high enough, then this is associated with a loss of efficiency at the drive.

An arrangement of the type in question, except for the temperature control nozzles, has most of the features defined at the outset, and is already known from the products offered by Bruker BioSpin GmbH, as is shown at the Internet site https://www.bruker.com/de/products/mr/nmr/probes/probes/solids/very-fast-mas/13-mm/overview.html and from the publication by D. Wilhelm et al. "Fluid flow dynamics in MAS systems", Journal of Magnetic Resonance 257 (2015) 51-63.

The document U.S. Pat. No. 7,915,893 B2, likewise cited at the outset, describes an arrangement which is entirely of the type in question and which has all of the features defined at the outset. In addition, a VT nozzle is shown which impinges obliquely on the rotor. The document describes a cryogenic probehead in which the coils are brought to cryogenic temperature, while the temperature of the measurement sample is controlled separately. Here, therefore, a spatial separation of electronics and rotor is necessary. The so-called spinner (rotor) is located in an outwardly closed pipe and its temperature is controlled via a temperature control nozzle. The temperature-controlled gas is distributed from a common pressure line to the bearing nozzles and the additional temperature control nozzles.

However, U.S. Pat. No. 7,915,893 B2 does not disclose how temperature control can be realized in an open system in which the rotor is not located in a narrow pipe. Nor does it disclose any relationship between the efficiency of the temperature control of the rotor and the velocity of the gas flow.

A considerable disadvantage of all of the temperature control devices known hitherto for MAS rotors is evident in operation at high speeds of the rotors during the measurement. Particularly at rotation frequencies f≥50 kHz, the air friction causes the rotors to become hot, which can lead to undesired changes or even to destruction of the measurement sample.

SUMMARY

Accordingly, an object of the present invention is to make available a method of the kind defined at the outset and a corresponding MAS stator for an NMR-MAS probehead, with which a considerably better temperature control is achieved even with very rapidly rotating MAS rotors.

This object is achieved by a method with the features defined at the outset, which method is characterized in that the flow speed of the temperature control gas blown through the temperature control nozzle onto the MAS rotor corresponds in the nozzle cross section to at least half the circumferential speed of the outer jacket of the rotating MAS rotor and to at most the speed of sound in the temperature control gas.

The present invention also makes available a correspondingly designed and dimensioned MAS stator for NMR-MAS spectroscopy, which permits substantially better temperature control of the MAS rotor, even at higher rotation frequencies.

In contrast to the prior art discussed above, the present invention seeks to blow in the pressurized air for cooling the MAS rotor at a defined minimum speed, in order thereby to bring about a significant exchange of the air layers at the rotor surface and, consequently, an improved cooling.

For better temperature control, it is critical that that the temperature control gas is blown onto the rotor surface at a higher speed compared to previous approaches. According to the invention, this speed is on the order of the circumferential speed of the rotor, preferably at least approximately half thereof. This result is surprising since the relatively low heat transfer of the conventional temperature control (VTN, DVT) was visible only in the simulations which are set out in FIGS. 5 and 6 and are explained in detail below. However, the known prior art is silent concerning the efficiency of the cooling. Theoretically, the transferred heat also depends on the flow speed. A minimum speed of the temperature control gas is needed such that the air layers are exchanged close to the rotor, i.e. a higher flow velocity leads to more heat transfer at the rotor.

Therefore, in order to achieve high speeds, small nozzles are provided according to the invention which generate a rapid stream of gas in the axial direction along the rotor when an elevated pressure is applied. This leads to the teaching of the present invention, according to which the speed of the stream of gas in the VT nozzle should be at least 50% of the circumferential speed of the rotor. The upper limit here is the speed of sound, which also represents the upper limit of the circumferential speed of the rotor.

A further advantage of the present invention is that the commercially available MAS stator scarcely needs to be modified, and the auxiliary parts require only a very small outlay in terms of material, and therefore the teaching according to the invention can be implemented extremely cost-effectively.

Particularly preferred variants of the invention are characterized in that the outer jacket of the MAS rotor has an external diameter D≤1.9 mm, and the MAS rotor is rotated at a rotation frequency f≥50 kHz, preferably f≥67 kHz. Although there is nothing in principle against the invention also being used with greater diameters, the heating, hence the advantage of the invention, is greater at smaller diameters of the MAS rotor.

In further advantageous variants of the method according to the invention, the standard volumetric flow of the temperature control gas blown through a temperature control nozzle is between 0.01 l/min and 10 l/min. Too small a gas flow provides inadequate temperature control, whereas too great a flow can have a negative impact on the rotation and may therefore also be uneconomical.

In physical terms, the method according to the invention can be carried out by using an MAS stator with a temperature control device which comprises at least one temperature control nozzle for controlling the temperature of the MAS rotor, wherein the MAS stator is characterized in that that the least one temperature control nozzle has an internal diameter d of between 0.04 mm and 0.5 mm, wherein a pressure of 1 bar to 5 bar is applied to the temperature control nozzle during operation.

It is specifically with this combination of features, namely the specific nozzle diameter and the applied pressure, that the optimal flow discussed above is accordingly achieved.

The scope of the present invention also covers an NMR-MAS probehead with an MAS stator of the type described above according to the invention, wherein the outer jacket of the MAS rotor has an external diameter D≤1.9 mm, in particular 0.7 mm≤D≤1.3 mm, wherein the MAS rotor is rotated at a rotation frequency f≥67 kHz. These embodiments of the invention prove particularly useful in practice. By contrast, the prior art according to U.S. Pat. No. 7,915,893 B2 cited at the outset discloses an external diameter D of the rotor of approximately 3 mm and regular rotation frequencies f of approximately 30 kHz.

Two fundamentally different stator variants can be used here, namely on the one hand a room temperature variant, in which the stator is open and the temperature control stream can escape into the environment, and, on the other hand, a closed cryo variant with cooled transmitter/receiver electronics, in which the rotor is operated in a closed pipe, such that the temperature control streams do not extend outward to the cryo electronics.

In a first class of advantageous embodiments of the NMR-MAS probehead according to the invention, the MAS stator therefore has an open construction, such that the stream of temperature control gas can escape into the environment after its contact with the outer jacket of the MAS rotor. In these embodiments, the temperature control nozzle is arranged in such a way that a stream of temperature control gas can be blown onto the outer jacket of the MAS rotor at an angle α≤45°, preferably α≤30°, relative to the longitudinal axis of the cylinder-symmetrical MAS rotor.

Since the temperature control nozzle in normal circumstances does not lie exactly at the rotor surface, the introduction of the temperature control gas should be targeted obliquely at the rotor. Moreover, a temperature control flow introduced obliquely in this way is better and more effective at entering the gap between the rotor and the RF coil surrounding same. Therefore, starting from the radial bearing, the nozzles preferably aim obliquely into this gap. It is thereby possible to more efficiently remove the friction heat from the rotor surface.

The gas stream is directed downward from the upper bearing, specifically at an impingement angle of 0° to 80°, preferably between 20° and 40°. A further advantage of the angle of attack of the nozzle, in contrast to conventional impingement nozzles, is that the rotor experiences a downwardly directed force which gives it stability, which is important particularly in the case of small rotors (i.e. with an external diameter D≤1.9 mm).

In an alternative class of embodiments of the NMR-MAS probehead according to the invention, the MAS stator has a closed construction, such that the stream of temperature control gas cannot escape directly into the environment after its contact with the outer jacket of the MAS rotor. The temperature control nozzle is then arranged in such a way that the angle α relative to the longitudinal axis of the cylinder symmetrical MAS rotor is α≤10°. In this variant, a stream of gas can also be guided parallel to the rotor. A central tube permits controlled guiding of the temperature control gas.

Developments of this class of embodiments are particularly preferred in which a gap with a gap width b of between 0.02 mm and 0.3 mm is left free for the stream of temperature control gas between the outer jacket of the MAS rotor and the surrounding inner surface of the MAS stator, so as to ensure a sufficient exchange of the streams in proximity to the rotor. The gap width can be set such that the temperature control is improved, albeit in some cases to the detriment of the required pressure.

Developments of this class of embodiments are advantageous in which the temperature control nozzle is arranged in such a way that a stream of temperature control gas can be blown along the outer jacket of the MAS rotor at an angle α≈0°, i.e. parallel to the longitudinal axis of the cylinder-symmetrical MAS rotor. In the case where a central tube is present, it is no longer absolutely necessary for the gas to be blown in obliquely, since the tube itself provides for the necessary guiding.

In other preferred developments of the invention, the MAS rotor is surrounded by a solenoid-shaped RF coil which is either unsupported or is wound onto the outer face of a tube and arranged in such a way that the stream of temperature control gas can be guided between the rotor and the tube or the coil. The RF coil is a necessary component part for NMR measurements. Together with a support tube, it also serves here to guide the temperature control gas.

These developments can be still further improved by the fact that the MAS rotor is surrounded by the solenoid-shaped RF coil at a distance of between 0.02 mm and 0.3 mm from the inner wall of the support tube. Here too, the gap width can in turn be set such that the temperature control of the MAS rotor is improved.

Embodiments of the NMR-MAS probehead according to the invention are advantageous in which several temperature control nozzles, in particular of identical configuration to each other, are present and are preferably arranged symmetrically about the longitudinal axis of the cylinder-symmetrical MAS rotor. A radial symmetry of this kind avoids mechanical influence of the rotor in a defined direction. Moreover, a multiplicity of nozzles permits a greater flow of temperature control gas.

Embodiments of the NMR-MAS probehead according to the invention are also particularly preferred in which the temperature control nozzle(s) is (are) built into a radial bearing of the MAS rotor. This results in a very compact structure. The simultaneous provision of the bearing and the temperature control by a uniform gas supply simplifies the MAS system.

Alternatively, in other embodiments of the NMR-MAS probehead, the temperature control nozzle(s) can be supplied with temperature control gas via a separate channel. In certain uses (e.g. at low temperature), it may on the other hand be necessary for the temperature control channel to be decoupled spatially and, if appropriate, also thermally. A further degree of freedom is obtained in this way, since the temperature control channel can then be operated independently of the bearing channel at any desired pressure and any desired temperature.

In practice, embodiments of the probehead according to the invention, in which the MAS rotor is constructed from sapphire, tetragonally stabilized zirconium oxide and/or silicon nitride, having a wall thickness between 0.2 mm and 0.7 mm, preferably approximately 0.3 mm and 0.55 mm, and having a diameter of less than 4 mm, in particular approximately 3.2 mm, approximately 1.9 mm or approximately 1.3 mm, have proven particularly effective. These materials are particularly suitable for MAS-NMR as they are non-magnetically electrically non-conductive, have sufficient mechanical rigidity in order to withstand the forces occurring in the case of rotation, and it is possible to set the wall thickness thereof for maximum transmission in the aforementioned manner.

Further advantages of the invention emerge from the description and the drawing. The features mentioned above and the features to be explained below may also, according to the invention, be used on their own in each case or together in any combination. The embodiments that are shown and described should not be understood as an exhaustive list and instead are of an illustrative nature for explaining the invention.

BRIEF DESCRIPTION OF THE DRAWINGS

The invention is shown in the drawing and is explained in more detail on the basis of illustrative embodiments.
In the drawing.

DETAILED DESCRIPTION

The invention in its physical form relates to a novel configuration of an MAS stator and of an NMR-MAS probehead with this MAS stator for carrying out the above-described method and has its main application as a constituent part of a magnetic resonance apparatus.

Figure 1:
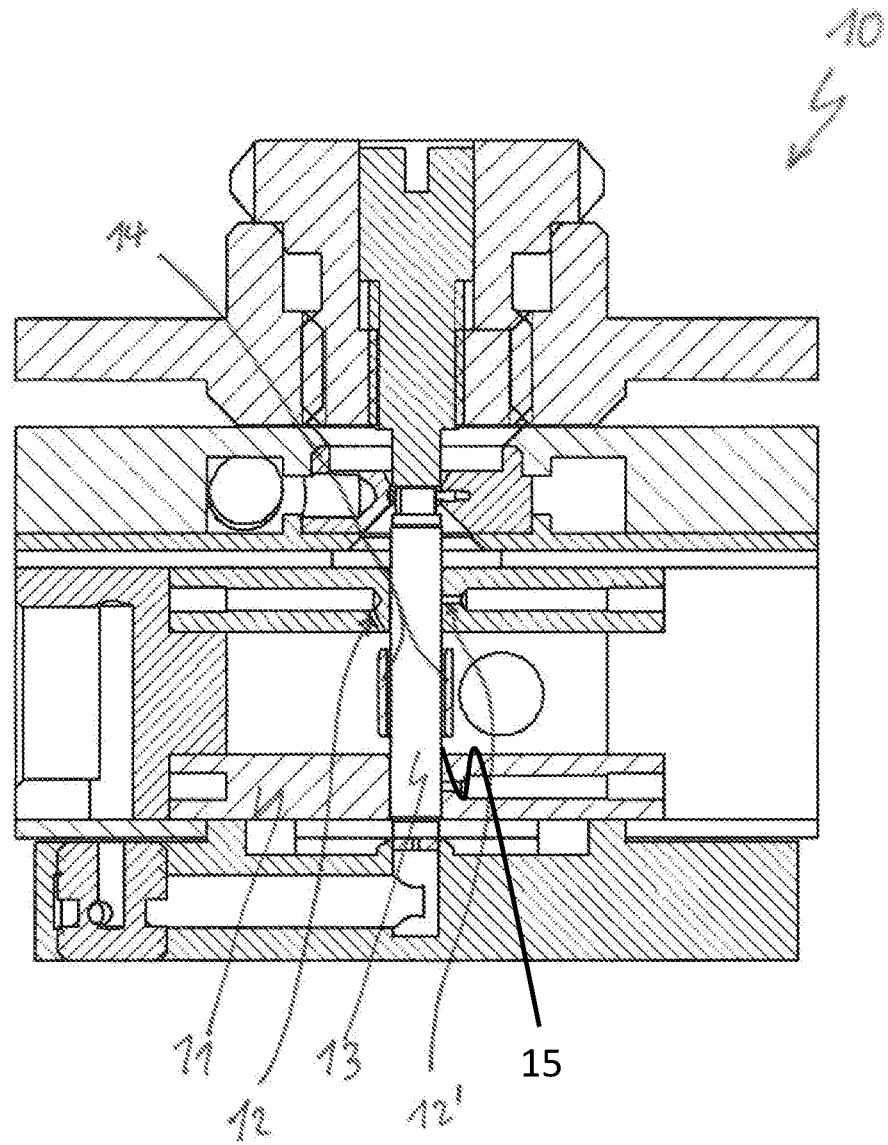
FIG. 1 shows a schematic cross-sectional view of an embodiment of the NMR-MAS probehead according to the invention, with an open MAS stator and with a temperature control nozzle directed at the MAS rotor obliquely with respect to the axis.
Figure 2:
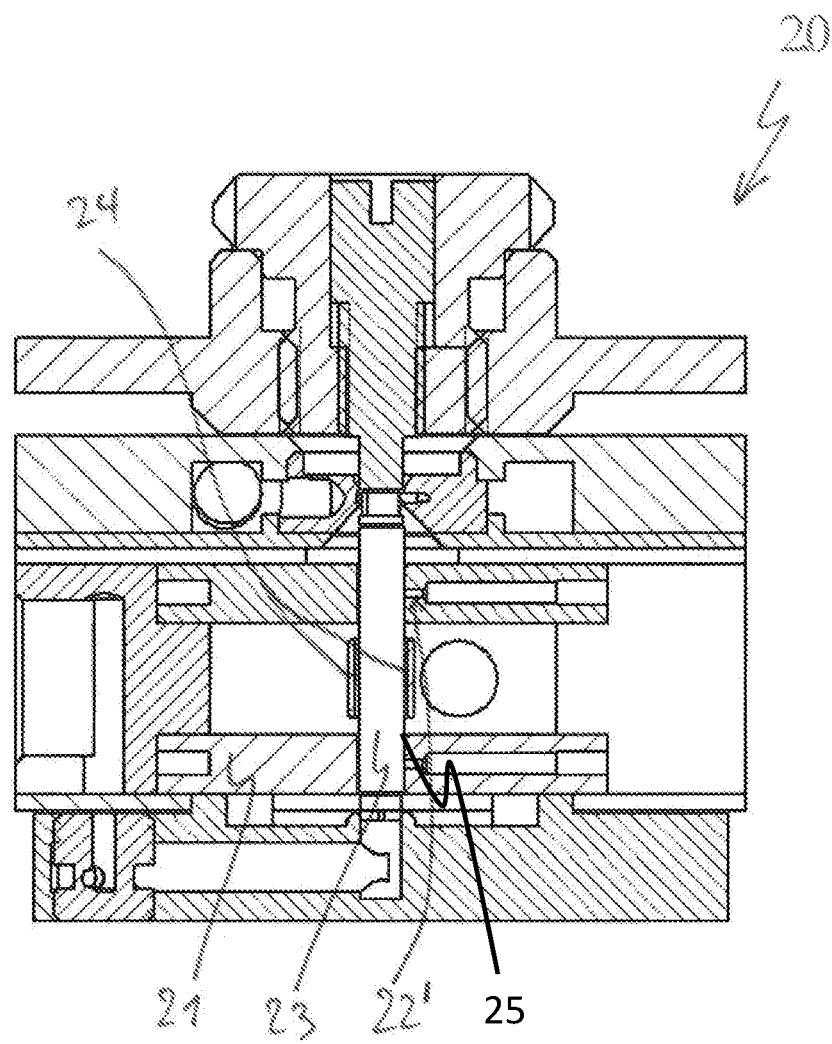
FIG. 2 shows a schematic cross-sectional view of an NMR-MAS probehead with an open MAS stator according to the prior art (Bruker BioSpin GmbH)
Figure 3A:
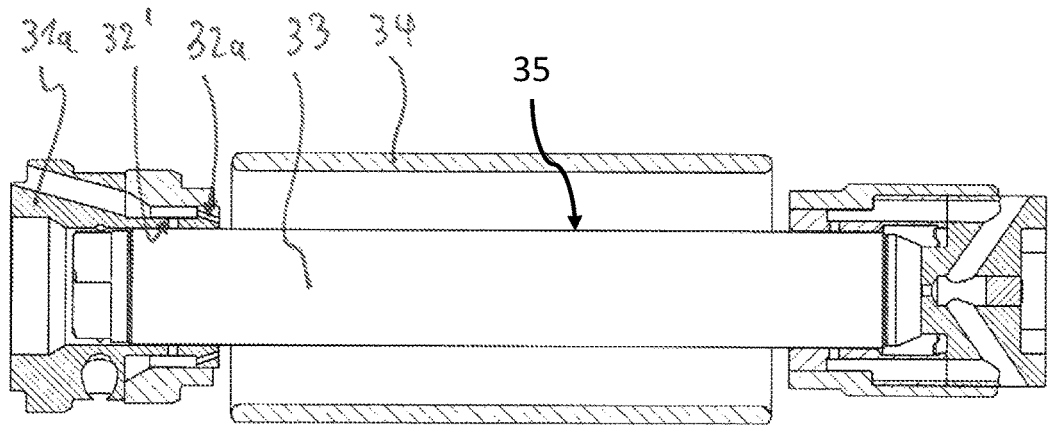
FIG. 3A shows a schematic cross-sectional view of an open embodiment of the MAS stator according to the invention, with temperature control nozzles directed obliquely at the MAS rotor.
Figure 3B:
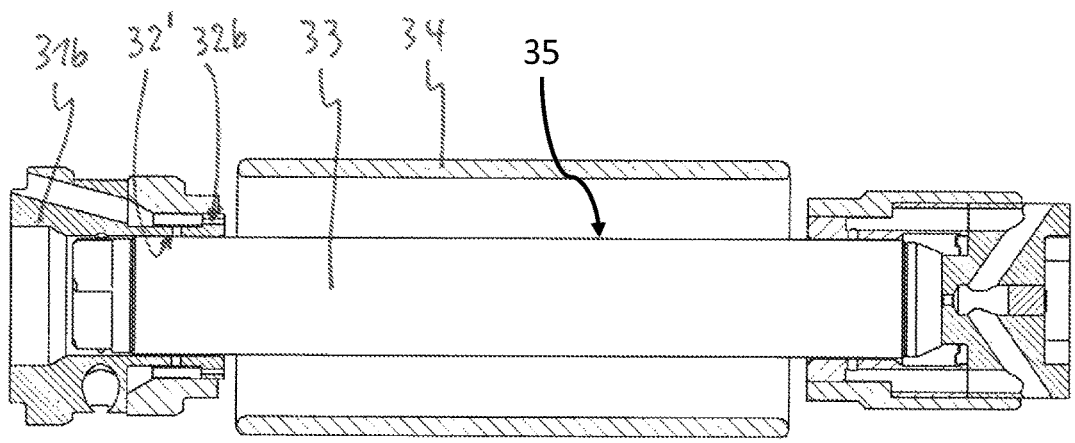
FIG. 3B shows an embodiment like FIG. 3A, but with temperature control nozzles directed parallel to the longitudinal axis of the MAS rotor.
Figure 4A:
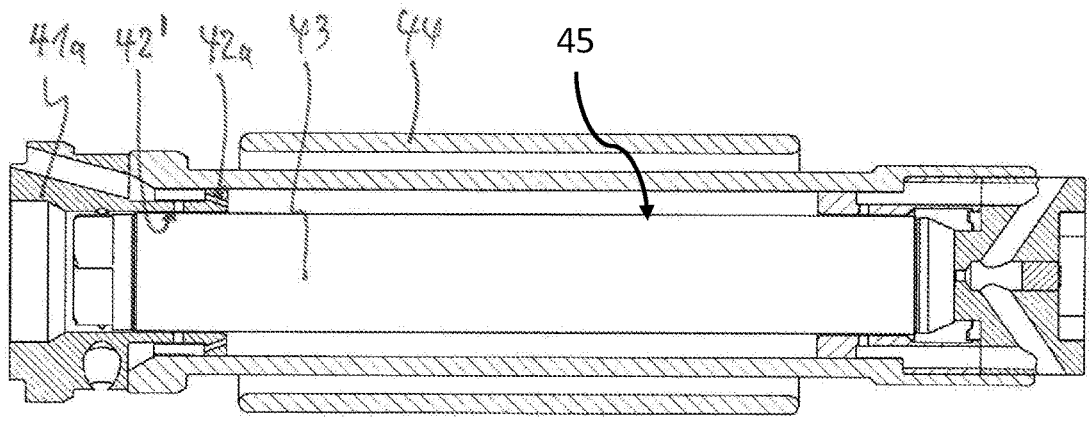
FIG. 4A shows a schematic cross-sectional view of a closed embodiment of the MAS stator according to the invention, with temperature control nozzles directed obliquely at the MAS rotor.
Figure 4B:
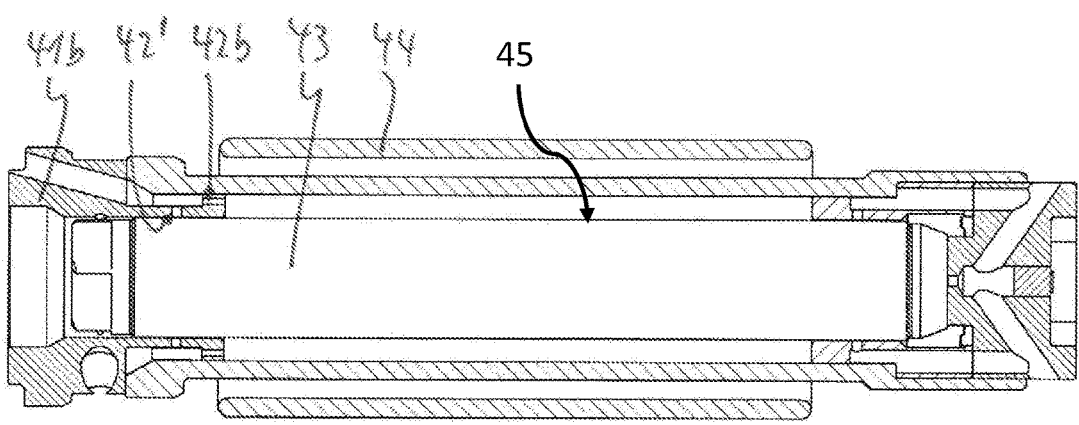
FIG. 4B shows an embodiment like FIG. 4A, but with temperature control nozzles directed parallel to the longitudinal axis of the MAS rotor.

All the embodiments of the arrangement according to the invention as shown in FIGS. 1 and 3A to 4B, but also arrangements according to the prior art (one of which is shown in FIG. 2), in each case comprise an MAS stator 11; 21; 31a; 31b; 41a; 41b of an NMR probehead 10; 20 for receiving a substantially circular-cylindrical hollow MAS rotor 13; 23; 33; 43. The MAS rotor 13; 23; 33; 43 has an outer jacket 15; 25; 35; 45 of external diameter D, which contains a sample substance in a sample volume, and can be mounted on pressurized gas in a measuring position within the MAS stator 11; 21; 31a; 31b; 41a; 41b via a gas supply device with at least one bearing nozzle 12'; 22'; 32'; 42' and can be set into rotation about the cylinder axis of the MAS rotor 13; 23; 33; 43 with a pneumatic drive, at a rotation frequency f. The MAS rotor 13; 23; 33; 43 is in each case surrounded by a solenoid-shaped RF coil 14; 24; 34; 44. Moreover, all the embodiments of the invention (and also arrangements according to the prior art) have one or more temperature control nozzles 12; 32a; 32b; 42a; 42b through which a temperature control gas is blown onto the outer jacket 15; 25; 35; 45 of the MAS rotor 13; 23; 33; 43 during an NMR-MAS measurement.

A primary aspect of the invention is characterized in that the flow speed of the temperature control gas blown through the temperature control nozzle 12; 32a; 32b; 42a; 42b onto the MAS rotor 13; 33; 43 corresponds in the nozzle cross section to at least half the circumferential speed of the outer jacket 15; 25; 35; 45 of the rotating MAS rotor 13; 33; 43 and to at most the speed of sound in the temperature control gas.

In the prior art, a temperature-controlled stream of gas is generally directed vertically onto the rotor directly by quite large nozzles. Thus, only a slight heat exchange can take place at the rotor, resulting in a heat gradient toward the center of the rotor.

By contrast, with the temperature control nozzles used according to the invention, and especially by applying the method according to the invention, the air stream is preferably blown in between coil and rotor by an angled nozzle and at a sufficiently high speed. In the depicted illustrative embodiments of the invention, the temperature control flow is in each case linked to the bearing nozzles, and the temperature control nozzle has a smaller diameter than the bearing nozzle, so that high flow speeds are achieved. The main flow in the gap between rotor and coil likewise extends there and ensures efficient cooling.

Depending on the dimensions of the nozzles and depending on the bearing pressure/temperature control pressure, the heating can be reduced and, within certain limits, the temperature distribution can also be made uniform. The simulation graphs show that, when the nozzles are made larger and the gas flow concomitantly increases, the cooling performance also increases. However, it can be equally advantageous to choose a flow or a nozzle size that permits a low temperature gradient. In each case, the invention allows the nature of the optimization to be monitored.

MAS stator with oblique or axial temperature control nozzles at an angle of 0°-80° to the rotor axis, are directed toward the rotor center and apply a stream of gas at a speed of at least 50% of the circumferential speed, temperature control nozzles are introduced in the radial bearing, and it is therefore possible to dispense with supply line nozzle diameter 0.04 mm to 0.5 mm temperature control nozzles which are positioned in the same way but are supplied with gas via a separate channel (advantage: the dual function of the bearing channel, air bearings of the rotor and temperature control is decoupled, the bearing channel can be operated at constant temperature)

The RF coil is mostly wound onto a tube such that the axial temperature control flow is guided along the rotor. Guiding of the VT stream together with a defined gap between rotor and central tube can bring further VT optimization. Central tube variants are also possible. The MAS rotor-stator system according to the invention is designed for rotor sizes with external diameters D≤1.9 mm. Specifically in these fairly small rotors, the friction heat is quite great, and it is difficult to control the temperature of the system. This is presumably also due to the lower mass and the smaller surface of the smaller rotors in relation to the frictional power.

For the mass flow rate $\dot{m}$ of an ideal gas with adiabatic exponent κ, which flows out of a tank with pressure $p_0$, density $\varrho_0$, temperature $T_0$ through a nozzle with cross-sectional surface area $A_1$, the following applies:

$$\dot{m} = A_1 \sqrt{\frac{2\kappa}{\kappa-1} p_0 \varrho_0} \cdot \sqrt{\left(\frac{p_1}{p_0}\right)^{2/\kappa} - \left(\frac{p_1}{p_0}\right)^{(\kappa+1)/\kappa}}$$

$p_1$ corresponds to the external pressure. The density of the gas $\varrho_0$ is related, for an ideal gas, with the pressure $p_0$ in the tank, as follows:

$$\varrho_0 = \frac{p_0}{R_S T}$$

$R_s$ is the specific gas constant of the gas in question.

The mass flow rate $\dot{m}$ has the unit $$\frac{kg}{s}$$

and can be converted as follows into the standard volumetric flow:

$$\dot{V}_n = \frac{\dot{m}}{\varrho} = \frac{R_S T_n}{p_n} \dot{m}$$

Here, $p_n$=1013 mbar and $T_n$=273 K (pressure and temperature at standard conditions).

The outflow speed from the nozzle is calculated as follows:

$$v_1 = \frac{\dot{m}}{\varrho_1 A_1} = \sqrt{\frac{2\kappa}{\kappa-1}\frac{p_0}{\varrho_0}\left[1-\left(\frac{p_1}{p_0}\right)^{(\kappa-1)/\kappa}\right]}$$

Figure 5:
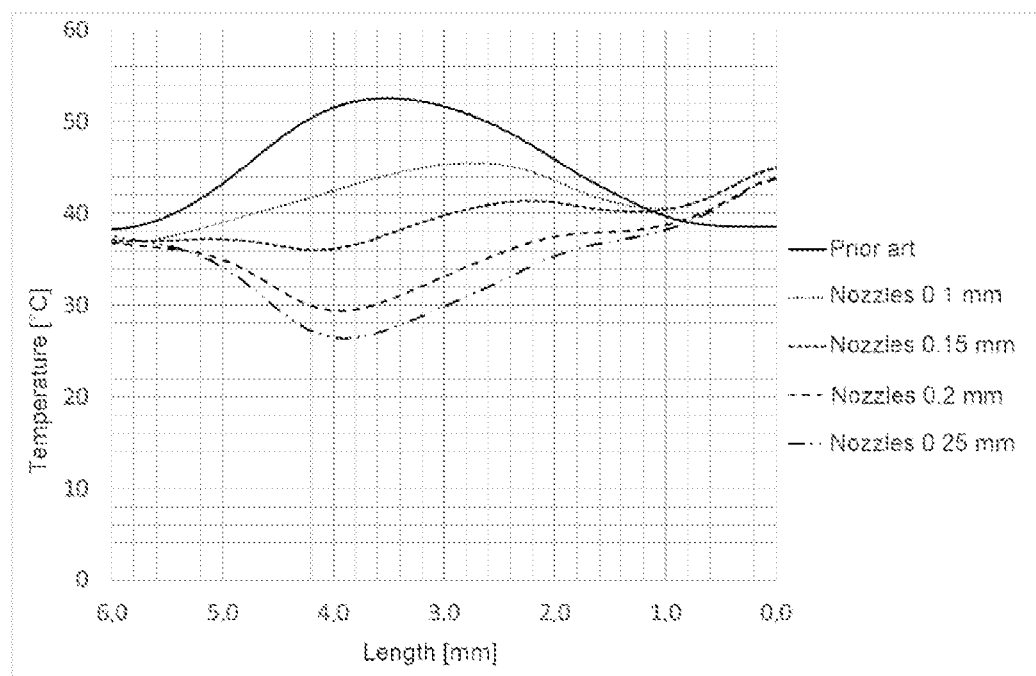
FIG. 5 shows a graph with calculated temperature profiles in the measurement sample along the rotor axis at different diameters of the temperature control nozzle.

In FIG. 5, the solid line signifies the prior art (as offered presently by Bruker BioSpin GmbH) and the broken lines signify the invention with different nozzles. This comparison graph illustrates that the maximum temperature and partially also the temperature gradient at the rotor is reduced with the temperature control nozzles. It also shows that not only the air speed has an influence on the rotor temperature, but also the flow rate. The larger the temperature control nozzle, the stronger also the cooling effect at the rotor.

Figure 6:
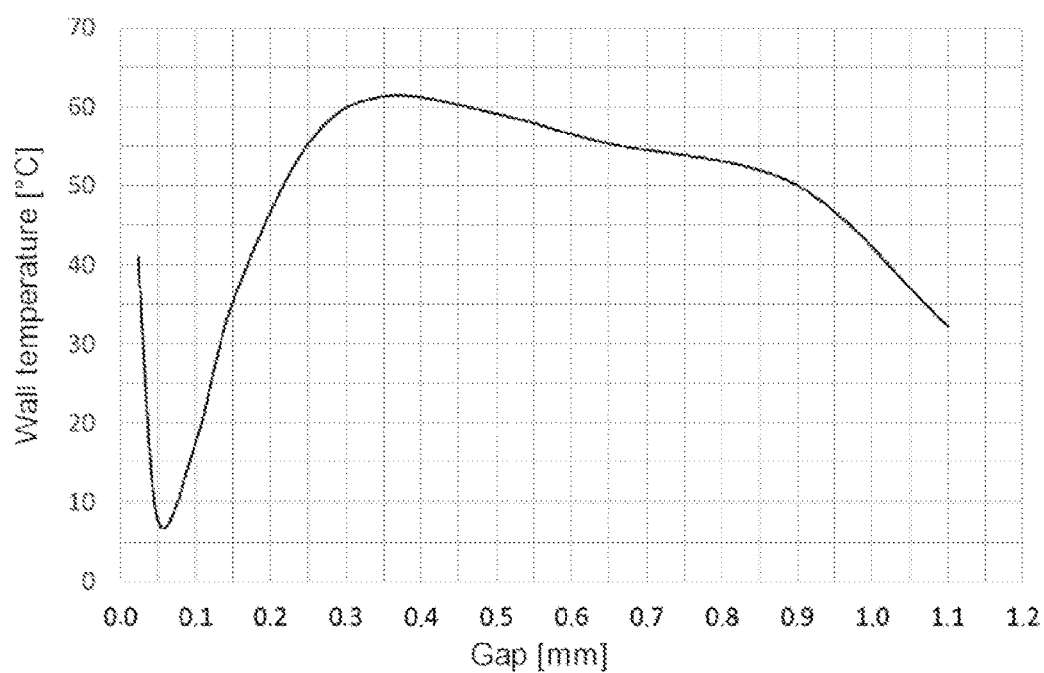
FIG. 6 shows a graph with the calculated profile of the wall temperature at a point of the MAS rotor as a function of the gap distance between the rotor and a central tube in a closed MAS stator.

FIG. 6 finally illustrates the profile of the temperature at a point of the rotor depending on the gap distance between rotor and central tube. It will be seen from this graph that the temperature on the rotor surface, starting from a large gap, initially increases when the gap is reduced. A maximum is achieved at a gap of approximately 0.35 mm. If the gap is further reduced, the cooling performance improves until reaching an optimum at ca. 0.6 mm, below which the temperature increases sharply again. However, it must be taken into consideration that a smaller gap requires a higher pressure, such that the optimum in terms of equipment e lies closer to 0.1 mm rather than at 0.06 mm.

LIST OF REFERENCE SIGNS

10; 20 NMR probehead
11; 21; 31a; 31b; 41a; 41b MAS stator
12'; 22'; 32'; 42' bearing nozzle(s)
12; 32a; 32b; 42a; 42b temperature control nozzles
13; 23; 33; 43' MAS rotor
14; 24; 34; 44 RF coil

What is claimed is:

1. A method for operating a Nuclear Magnetic Resonance (NMR) probehead having a Magic-Angle-Spinning (MAS) stator configured to receive a substantially circular-cylindrical hollow MAS rotor with an outer jacket of external diameter D and with a sample substance in a sample volume, comprising:
    mounting the MAS rotor on pressurized gas in a measuring position within the MAS stator via a gas supply device having a bearing nozzle, and
    rotating the MAS rotor about a cylinder axis of the MAS rotor with a pneumatic drive at a rotation frequency $f \geq 30$ kHz,
    during an NMR-MAS measurement, blowing a temperature control gas with a temperature control nozzle onto an outer jacket of the MAS rotor at an angle $\alpha < 90°$ with respect to a longitudinal axis of the cylinder-symmetrical MAS rotor, and
    regulating a flow speed of the temperature control gas blown through the temperature control nozzle onto the MAS rotor to correspond in the nozzle cross section to at least half a circumferential speed of the outer jacket of the rotating MAS rotor and to at most an upper limit of the circumferential speed of the outer jacket of the rotating MAS rotor.

2. The method as claimed in claim 1, wherein the outer jacket of the MAS rotor has an external diameter $D \leq 1.9$ mm, and the MAS rotor is rotated at a rotation frequency $f \geq 50$ kHz.

3. The method as claimed in claim 2, wherein the MAS rotor is rotated at a rotation frequency $f \geq 67$ kHz.

4. The method as claimed in claim 1, wherein a standard volumetric flow of the temperature control gas blown through the temperature control nozzle is between 0.01 l/min and 10 l/min.

5. An MAS stator configured to carry out the method as claimed in claim 1, with a temperature control device which comprises at least one temperature control nozzle configured to control the temperature of the MAS rotor, wherein the at least one temperature control nozzle has an internal diameter d of between 0.04 mm and 0.5 mm, and wherein a pressure of between 1 bar to 5 bar is applied to the temperature control nozzle.

6. An NMR-MAS probehead with an MAS stator as claimed in claim 5, wherein the outer jacket of the MAS rotor has an external diameter $D \leq 1.9$ mm and wherein the MAS rotor is rotated at a rotation frequency $f \geq 67$ kHz.

7. The NMR-MAS probehead with an MAS stator as claimed in claim 6, wherein the outer jacket of the MAS rotor has an external diameter $0.7$ mm $\leq D \leq 1.3$ mm.

8. The NMR-MAS probehead as claimed in claim 6, wherein the MAS stator has an open construction, such that a stream of temperature control gas escapes into the environment after contacting the outer jacket of the MAS rotor, and wherein the temperature control nozzle is arranged such that the stream of temperature control gas is blown onto the outer jacket of the MAS rotor at an angle $\alpha \leq 45°$ relative to the longitudinal axis of the cylinder-symmetrical MAS rotor.

9. The NMR-MAS probehead as claimed in claim 8, wherein the temperature control nozzle is arranged such that the stream of temperature control gas is blown onto the outer jacket of the MAS rotor at an angle $\alpha \leq 30°$ relative to the longitudinal axis of the cylinder-symmetrical MAS rotor.

10. The NMR-MAS probehead as claimed in claim 6, wherein the MAS stator has a closed construction, such that a stream of temperature control gas cannot escape directly into the environment after contacting the outer jacket of the MAS rotor, and wherein the temperature control nozzle is arranged such that an angle $\alpha$ relative to the longitudinal axis of the cylinder-symmetrical MAS rotor (43) is $\alpha \leq 10°$.

11. The NMR-MAS probehead as claimed in claim 10, wherein a gap with a gap width b of between 0.02 mm and 0.3 mm is left free for the stream of temperature control gas between the outer jacket of the MAS rotor and the surrounding inner surface of the MAS stator.

12. The NMR-MAS probehead according to claim 10, wherein the temperature control nozzle is arranged such that a stream of temperature control gas is blown along the outer jacket of the MAS rotor at an angle $\alpha \approx 0°$, which is parallel to the longitudinal axis of the cylinder-symmetrical MAS rotor.

13. The NMR-MAS probehead as claimed in claim 6, wherein the MAS rotor is surrounded by a solenoid-shaped RF coil which is wound onto the outer face of a tube and is arranged such that the stream of temperature control gas is guided between the rotor and the tube.

14. The NMR-MAS probehead according to claim 13, wherein the MAS rotor is surrounded by the solenoid-shaped RF coil at a distance of between 0.02 mm and 0.3 mm from the inner wall of the tube.

15. The NMR-MAS probehead as claimed in claim 6, further comprising further temperature control nozzles, wherein the temperature control nozzles are arranged about the longitudinal axis of the cylinder-symmetrical MAS rotor.

16. The NMR-MAS probehead as claimed in claim 15, wherein the temperature control nozzles are of identical configuration to each other and are arranged symmetrically about the longitudinal axis of the cylinder-symmetrical MAS rotor.

17. The NMR-MAS probehead as claimed in claim 6, wherein the temperature control nozzle is built into a radial bearing of the MAS rotor.

18. The NMR-MAS probehead as claimed in claim 6, wherein the temperature control nozzle is supplied with temperature control gas via a separate line.

19. The NMR-MAS probehead as claimed in claim 6, wherein the MAS rotor is constructed from sapphire, tetragonally stabilized zirconium oxide and/or silicon nitride, with a wall thickness of between 0.2 mm and 0.7 mm.

* * * * *